(12) United States Patent
Takimoto et al.

(10) Patent No.: US 8,896,365 B2
(45) Date of Patent: Nov. 25, 2014

(54) SEMICONDUCTOR SWITCH HAVING REVERSE VOLTAGE APPLICATION CIRCUIT AND POWER SUPPLY DEVICE INCLUDING THE SAME

(75) Inventors: Kazuyasu Takimoto, Fuchu (JP);
Hiroshi Mochikawa, Hachioji (JP);
Yosuke Nakazawa, Kunitachi (JP);
Hiromichi Tai, Saitama (JP); Atsuhiko Kuzumaki, Kodaira (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 357 days.

(21) Appl. No.: 13/372,728

(22) Filed: Feb. 14, 2012

(65) Prior Publication Data
US 2012/0206899 A1 Aug. 16, 2012

(30) Foreign Application Priority Data
Feb. 15, 2011 (JP) ................. 2011-030131

(51) Int. Cl.
*H03K 17/60* (2006.01)
*H03K 17/687* (2006.01)
*H03K 17/16* (2006.01)
*H02M 7/797* (2006.01)
*H03K 17/0814* (2006.01)
*H02M 1/34* (2007.01)

(52) U.S. Cl.
CPC ....... *H03K 17/168* (2013.01); *H02M 2001/342* (2013.01); *H02M 7/797* (2013.01); *Y02B 70/1491* (2013.01); *H03K 17/08148* (2013.01)
USPC ........................................... 327/432

(58) Field of Classification Search
USPC ................ 327/427, 432; 363/132, 133
See application file for complete search history.

(56) References Cited

U.S. PATENT DOCUMENTS

| | | | |
|---|---|---|---|
| 5,408,150 A | 4/1995 | Wilcox | |
| 6,058,037 A | 5/2000 | Shibata et al. | |
| 7,724,556 B2 | 5/2010 | Mochikawa et al. | |
| 8,604,841 B2 * | 12/2013 | Lobsiger et al. | 327/108 |
| 2004/0179380 A1 | 9/2004 | Yamashita | |
| 2008/0253158 A1 * | 10/2008 | Mochikawa et al. | 363/133 |
| 2010/0008113 A1 | 1/2010 | Kuno et al. | |
| 2011/0157921 A1 | 6/2011 | Lo et al. | |
| 2012/0206190 A1 | 8/2012 | Takimoto et al. | |

FOREIGN PATENT DOCUMENTS

| | | |
|---|---|---|
| CN | 101401289 A | 4/2009 |
| EP | 2006991 A1 | 12/2008 |
| JP | 10-327585 A | 12/1998 |
| JP | 10323015 A | 12/1998 |

(Continued)

OTHER PUBLICATIONS

U.S. Appl. No. 13/372,779; First Named Inventor: Kazuyasu Takimoto; Title: "Semiconductor Device"; filed Feb. 14, 2012.

(Continued)

*Primary Examiner* — Hai L Nguyen
(74) *Attorney, Agent, or Firm* — Holtz, Holtz, Goodman & Chick PC

(57) ABSTRACT

According to one embodiment, a semiconductor switch includes a main element including a switching element and an antiparallel diode, and a reverse voltage application circuit. The reverse voltage application circuit includes an auxiliary electric-power supply, a high-speed free wheeling diode, an auxiliary element, and a capacitor. The high-speed free wheeling diode comprises a plurality of diodes connected in series.

10 Claims, 4 Drawing Sheets

(56) References Cited

FOREIGN PATENT DOCUMENTS

| JP | 2002-135097 A | 5/2002 |
|----|---------------|--------|
| JP | 2005-012950 A | 1/2005 |
| JP | 2006-141167 A | 6/2006 |
| JP | 2006-141168 A | 6/2006 |
| JP | 2007-074858 A | 3/2007 |
| JP | 2007-082303 A | 3/2007 |
| JP | 2007-159290 A | 6/2007 |
| JP | 2007-202329 A | 8/2007 |
| JP | 2007-252055 A | 9/2007 |
| JP | 2008-193839 A | 8/2008 |
| JP | 2008271637 A | 11/2008 |
| JP | 2011030424 A | 2/2011 |

OTHER PUBLICATIONS

Chinese Office Action dated Dec. 13, 2013 (and English translation thereof) in counterpart Chinese Application No. 201210031281.8.
"Japanese Office Action dated Mar. 11, 2014 in counterpart Japanese Application No. 2011-030131".
Partial European Search Report dated Mar. 5, 2014 (in English) in counterpart European Application No. 12155411.7.
Barry Wayne Williams; "Series and Parallel Device Operation and Protection; Power Electronics: Devices, Drivers, Applications, and Passive Components"; Feb. 25, 2006; University of Strathclyde, Glasgow; pp. 227-263.

* cited by examiner

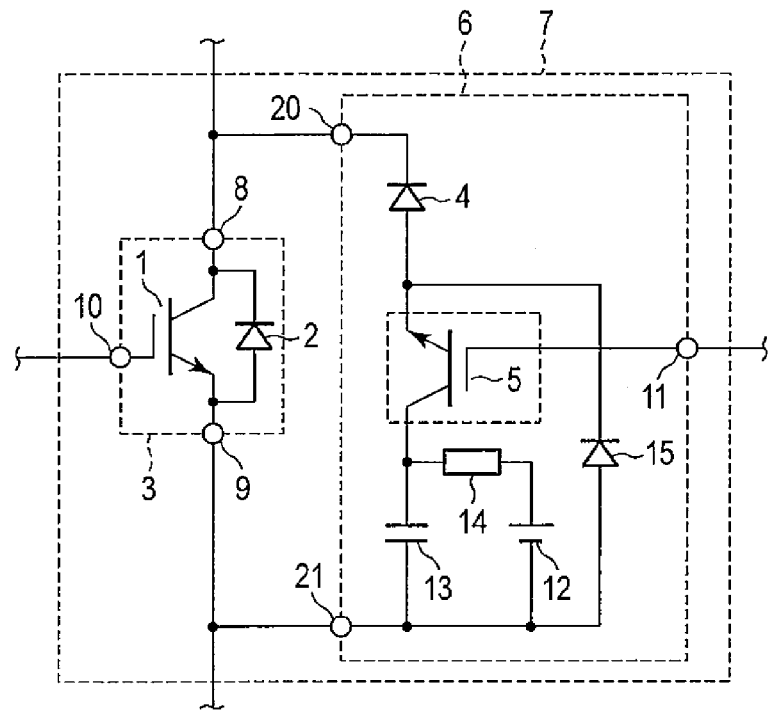
F I G. 4
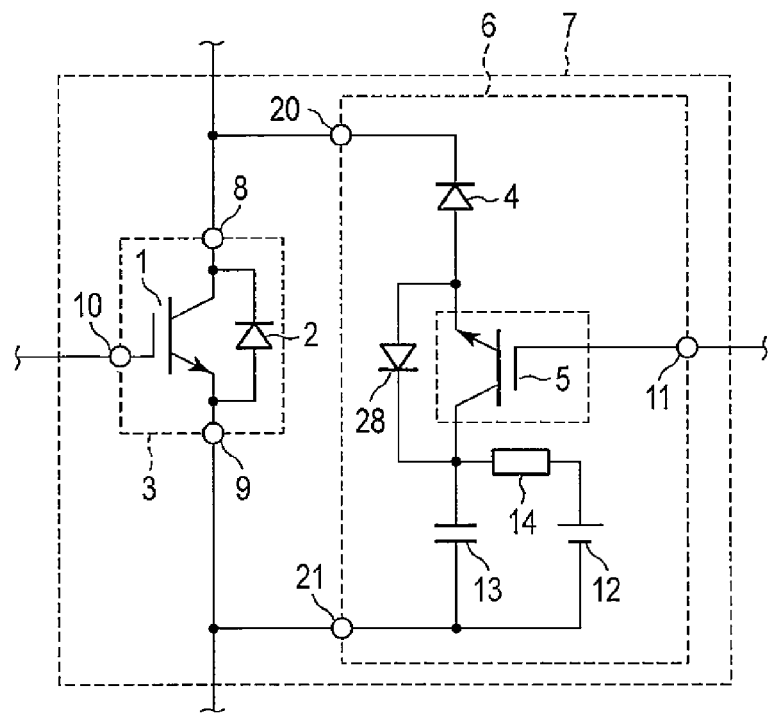
F I G. 5

SEMICONDUCTOR SWITCH HAVING REVERSE VOLTAGE APPLICATION CIRCUIT AND POWER SUPPLY DEVICE INCLUDING THE SAME

CROSS-REFERENCE TO RELATED APPLICATIONS

This application is based upon and claims the benefit of priority from prior Japanese Patent Application No. 2011-030131, filed Feb. 15, 2011, the entire contents of which are incorporated herein by reference.

FIELD

Embodiments described herein relate generally to a semiconductor switch.

BACKGROUND

In recent years, much effort has been made to develop techniques for various electric-power conversion devices. For example, if an electric-power conversion device includes an inverter circuit, the inverter circuit is formed of a plurality of semiconductor switches. Semiconductor switches are based on electric-power switching elements. A main element in a semiconductor switch comprises a switching element for electric-power and an antiparallel diode connected in anti-parallel with the switching element. Much effort has also been made to develop techniques to improve the reverse recovery property of antiparallel diodes.

In addition to the main element, the semiconductor switch comprises a reverse voltage application circuit. The reverse voltage application circuit applies a reverse voltage lower than a withstand voltage of the main element to the antiparallel diode. The reverse voltage application circuit forms one arm of a bridge circuit.

The reverse voltage application circuit comprises an auxiliary electric-power supply providing a voltage smaller than that of the withstand voltage of the main element, an auxiliary element which is turned on at the time of reverse recovery of the antiparallel diode and which has a lower withstand voltage than the main element, a high-speed free wheeling diode having a reverse recovery time of which is shorter than the antiparallel diode, and a reverse recovery charge of which is smaller than the antiparallel diode, and a capacitor connected in parallel with the auxiliary electric-power supply. The auxiliary electric-power supply, the auxiliary element and the high-speed free wheeling diode are connected together in series.

The auxiliary element is turned on during a period of dead time, whereby a main current is commutated from the antiparallel diode to the high-speed free wheeling diode by a supply of energy from the capacitor charged by the auxiliary electric-power supply. In the state where the high-speed free wheeling diode performs return current operation, an on signal is input to a control terminal of the main element on the opposite arm. Thus, instead of the antiparallel diode, the high-speed free wheeling diode performs a reverse recovery operation. This technique, compared to conventional methods, enables a significant reduction in a surge current resulting from the reverse recovery.

BRIEF DESCRIPTION OF THE DRAWINGS

FIG. 4 is a circuit diagram showing a semiconductor switch according to a third embodiment;

FIG. 5 is a circuit diagram showing a semiconductor switch according to a fourth embodiment;

DETAILED DESCRIPTION

Figure 1:
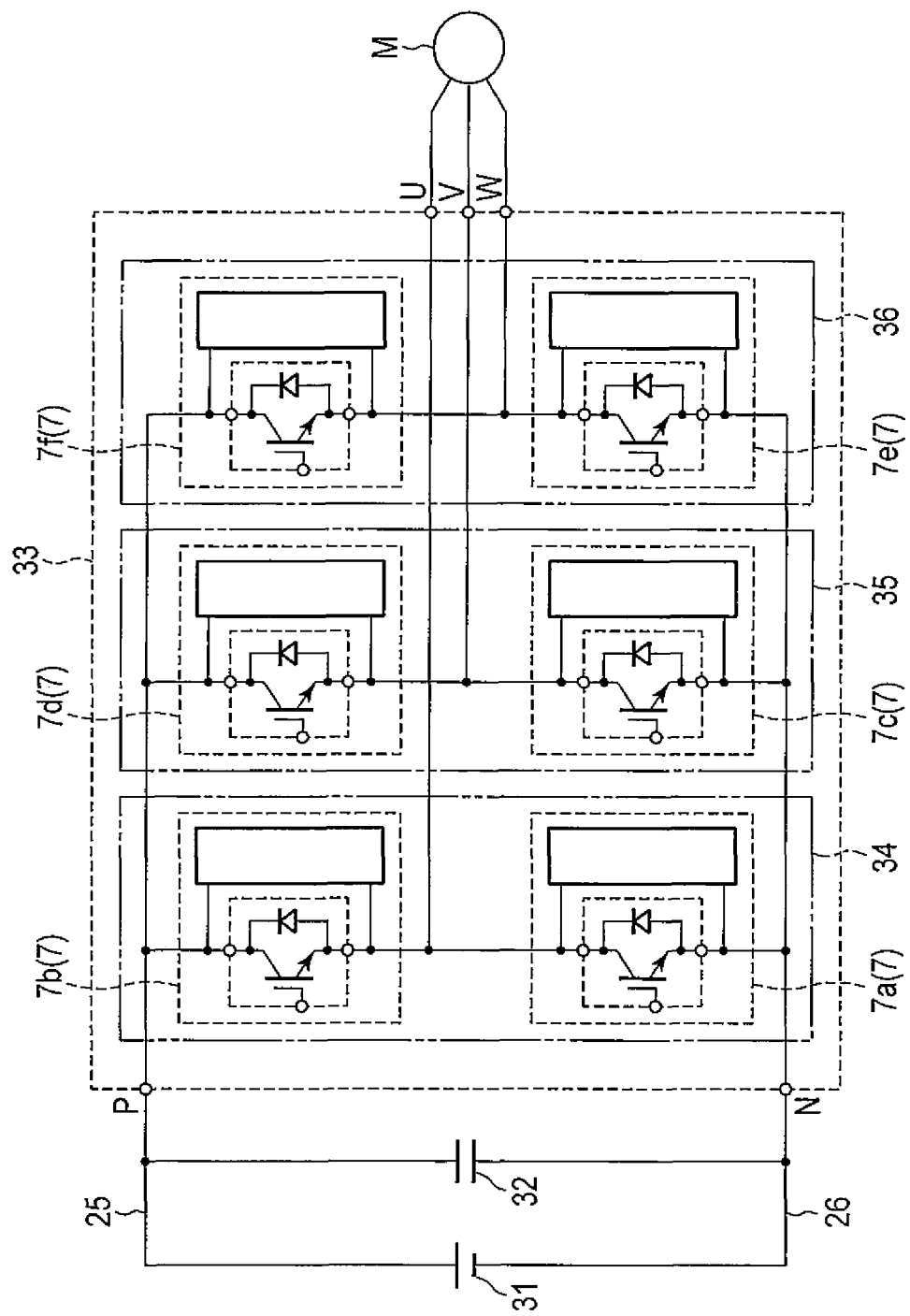
FIG. 1 is a circuit diagram showing an electric-power conversion device provided with a semiconductor switch according to a first embodiment.

In general, according to one embodiment, there is provided a semiconductor switch comprising: a main element including a voltage-drive-type switching element and an antiparallel diode connected in anti-parallel with the switching element; and a reverse voltage application circuit configured to apply a reverse voltage lower than a withstand voltage of the main element to the antiparallel diode. The reverse voltage application circuit comprises an auxiliary electric-power supply having a voltage smaller than the withstand voltage of the main element, a high-speed free wheeling diode having a reverse recovery time of which is shorter than the antiparallel diode, and a reverse recovery charge of which is smaller than the antiparallel diode, an auxiliary element connected between the auxiliary electric-power supply and the high-speed free wheeling diode, configured to be turned on at the time of reverse recovery of the antiparallel diode, and having a withstand voltage of which is lower than the main element, and a capacitor connected in parallel with the auxiliary electric-power supply. The high-speed free wheeling diode comprises a plurality of diodes connected in series.

According to another embodiment, there is provided a semiconductor switch comprising: a main element including a voltage-drive-type switching element and an antiparallel diode connected in anti-parallel with the switching element; and a reverse voltage application circuit configured to apply a reverse voltage lower than a withstand voltage of the main element to the antiparallel diode. The reverse voltage application circuit comprises an auxiliary electric-power supply having a voltage smaller than the withstand voltage of the main element, a high-speed free wheeling diode having a reverse recovery time of which is shorter than the antiparallel diode, and a reverse recovery charge of which is smaller than the antiparallel diode, an auxiliary element connected between the auxiliary electric-power supply and the high-speed free wheeling diode, configured to be turned on at the time of reverse recovery of the antiparallel diode, and having a withstand voltage of which is lower than the main element, a capacitor connected in parallel with the auxiliary electric-power supply, and a diode comprising an anode connected to a negative terminal of the auxiliary electric-power supply and a cathode connected to a negative terminal of the auxiliary element.

According to another embodiment, there is provided a semiconductor switch comprising: a main element including a voltage-drive-type switching element and an antiparallel diode connected in anti-parallel with the switching element; and a reverse voltage application circuit configured to apply a reverse voltage lower than a withstand voltage of the main element to the antiparallel diode. The reverse voltage application circuit comprises an auxiliary electric-power supply having a voltage smaller than the withstand voltage of the main element, a high-speed free wheeling diode having a reverse recovery time of which is shorter than the antiparallel diode, and a reverse recovery charge of which is smaller than the antiparallel diode, an auxiliary element connected between the auxiliary electric-power supply and the high-speed free wheeling diode, configured to be turned on at the time of reverse recovery of the antiparallel diode, and having a withstand voltage of which is lower than the main element, a capacitor connected in parallel with the auxiliary electric-power supply, and another antiparallel diode connected in anti-parallel with the auxiliary element.

A semiconductor switch according to a first embodiment will be described below in detail with reference to the drawings. In the present embodiment, an electric-power conversion device with a plurality of semiconductor switches will be described. The electric-power conversion device according to the present embodiment has a large capacity.

As shown in FIG. 1, the electric-power conversion device comprises a DC voltage source 31, a smoothing capacitor 32, and a two-level inverter circuit 33 serving as an inverter circuit. The two-level inverter circuit 33 is connected to and cooled by a cooler (not shown in the drawings).

The DC voltage source 31 is obtained by rectifying three-phase AC electric-power supply. The capacitor 32 and the two-level inverter circuit 33 are connected between a positive DC bus 25 and a negative DC bus 26 of the DC voltage source 31. The two-level inverter circuit 33 is formed of three semiconductor switch groups; 34, 35 and 36. The semiconductor switch groups 34, 35 and 36 are connected together in parallel.

The semiconductor switch group 34 includes a first semiconductor switch 7a and a second semiconductor switch 7b connected together in series between a terminal N of the negative potential side and a terminal P of the positive potential side. The semiconductor switch group 35 includes a first semiconductor switch 7c and a second semiconductor switch 7d connected together in series between the terminal N of the negative potential side and the terminal P of the positive potential side. The semiconductor switch group 36 includes a first semiconductor switch 7e and a second semiconductor switch 7f connected together in series between the terminal N of the negative potential side and the terminal P of the positive potential side.

The two-level inverter circuit 33 converts DC electric-power input through the terminal N of the negative potential side and the terminal P of the positive potential side into AC electric-power, and supplies the AC electric-power to a load M through output terminals U, V and W.

Now, a semiconductor switch 7 (7a to 7f) will be described.

Figure 2:
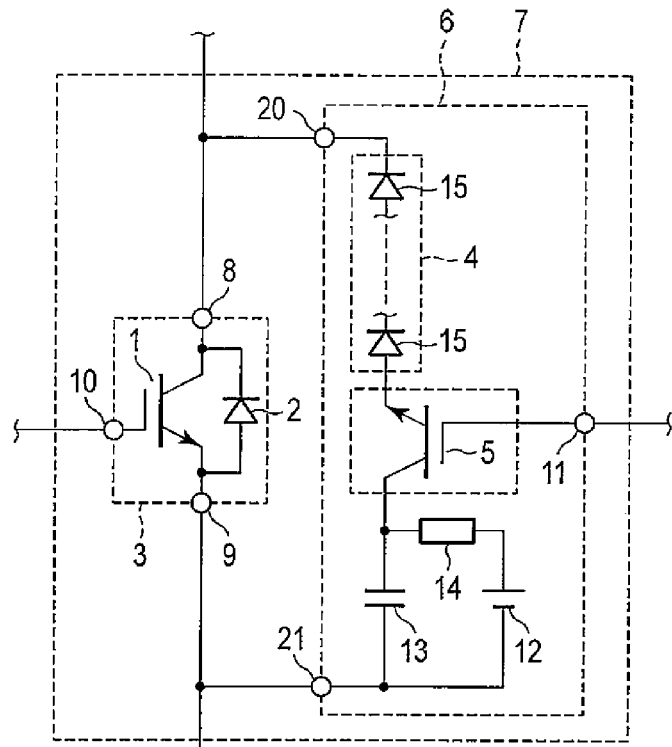
FIG. 2 is a circuit diagram showing the semiconductor switch according to the first embodiment.

As shown in FIG. 2, the semiconductor switch 7 comprises a main element 3 and a reverse voltage application circuit 6. The main element 3 comprises a voltage-drive-tyre switching element 1 and an antiparallel diode 2.

The switching element 1 comprises a positive terminal 8, a negative terminal 9, and a control terminal 10. In the present embodiment, the switching element 1 is formed of an IGBT (Insulated Gate Bipolar Transistor). In the switching element 1, a control signal is supplied to the control terminal 10, thereby switching the element 1 to a conductive state or a non-conductive state. For example, in the switching element 1, the gate signal is supplied to the control terminal 10 (gate) from a gate driving circuit (not shown in the drawings), whereby the switching element 1 is switched to the conductive state (on) or the non-conductive state (off).

The antiparallel diode 2 is connected in anti-parallel with the switching element 1.

The reverse voltage application circuit 6 comprises a positive terminal 20 electrically connected to the positive terminal 8 and a negative terminal 21 electrically connected to the negative terminal 9. The reverse voltage application circuit 6 can apply a reverse voltage lower than the withstand voltage of the main terminal 3 to the antiparallel diode 2.

The reverse voltage application circuit 6 comprises an auxiliary electric-power supply 12, a high-speed free wheeling diode 4, an auxiliary element 5, a capacitor 13, and a charging resistor 14. A negative side of the auxiliary electric-power supply 12 is electrically connected to the negative terminal 21. The auxiliary electric-power supply 12 has a voltage smaller than the withstand voltage of the main element 3. A cathode side of the high-speed free wheeling diode 4 is electrically connected to the positive terminal 20.

The high-speed free wheeling diode 4 has a reverse recovery time shorter than the antiparallel diode, and a reverse recovery charge smaller than the antiparallel diode 2.

The auxiliary element 5 is connected between a positive side of the auxiliary electric-power supply 12 and an anode of the high-speed free wheeling diode 4. The auxiliary element 5 comprises a control terminal 11, and a control signal is supplied to the control terminal 11, thereby switching the auxiliary element 5 to the conducting state or the non-conducting state. For example, in the auxiliary element 5, a gate signal is supplied to the control terminal 11 (gate) from a gate driving circuit (not shown in the drawings), whereby the auxiliary element 5 is switched on or off. The auxiliary element 5 is turned on at the time of reverse recovery of the antiparallel diode 2, and has a withstand voltage lower than the main element 3.

The charging resistor 14 is electrically connected between the auxiliary electric-power supply 12 and the auxiliary element 5. The high-speed free wheeling diode 4, the auxiliary element 5, the charging resistor 14 and the auxiliary electric-power supply 12 are connected together in series.

The capacitor 13 is connected in parallel with the auxiliary electric-power supply 12 and specifically with the auxiliary electric-power supply 12 and charging resistor 14 with which the capacitor 13 is connected in parallel.

The high-speed free wheeling diode 4 is formed of a plurality of diodes 15 connected together in series. Each of the diodes 15 is intended for a low withstand voltage.

The electric-power conversion device comprising the semiconductor switch 7 is formed as described below.

In the semiconductor switch group 34, as shown in FIG. 1 and FIG. 2, a period of dead time is present in which the switching elements 1 in the first semiconductor switch 7a and second semiconductor switch 7b are turned off.

In the first semiconductor switch 7a, the auxiliary element 5 is turned on during the period of dead time, whereby the main current is commutated from the antiparallel diode 2 to the high-speed free wheeling diode 4 by a supply of energy from the capacitor 13 charged by the auxiliary electric-power supply 12. In the state where the high-speed free wheeling diode 4 performs return current operation, the switching element 1 of the second semiconductor switch 7b is switched on, and hence the high-speed free wheeling diode 4 causes reverse recovery in place of the antiparallel diode 2. This enables a significant reduction in a surge current resulting from the reverse recovery.

According to the electric-power conversion device provided with the semiconductor switch 7 according to the first embodiment, the semiconductor switch 7 comprises the main element 3 comprising the switching element 1 and the antiparallel diode 2, and the reverse voltage application circuit 6 configured to apply a reverse voltage lower than the withstand voltage of the main element 3 to the antiparallel diode 2.

The reverse voltage application circuit 6 comprises the auxiliary electric-power supply 12 havinga voltage smaller than the withstand voltage of the main element 3, the high-speed free wheeling diode 4 having a reverse recovery time of which shorter than the antiparallel diode, and a reverse recovery charge of which is smaller than the antiparallel diode, the auxiliary element 5 connected between the auxiliary electric-power supply 12 and the high-speed free wheeling diode 4, turned on at the time of reverse recovery of the antiparallel diode 2, and having a withstand voltage of which is lower than the main element 3, and the capacitor 13 connected in parallel with the auxiliary electric-power supply 12. Since the high-speed free wheeling diode 4 performs a reverse recovery operation instead of the antiparallel diode 2, a surge current resulting from the reverse recovery can be significantly reduced.

The high-speed free wheeling diode 4 is formed of the multiple low-withstand-voltage diodes 15 connected together in series. A voltage applied to the high-speed free wheeling diode 4 can be shared by the plurality of diodes 15, that is, the withstand voltage of the high-speed free wheeling diode 4 can be increased. Thus, even if the electric-power conversion device has a large capacity, possible failures in the high-speed free wheeling diode 4 such as the possible destruction of the high-speed free wheeling diode 4 can be inhibited.

High-withstand-voltage elements are often more difficult to manufacture than low-withstand-voltage elements. The high-speed free wheeling diode 4 is formed of the multiple low-withstand-voltage diodes 15 connected together in series. Thus, the withstand voltage of the high-speed free wheeling diode 4 can be increased by using diodes (low-withstand-voltage diodes) which have a lower withstand voltage and can be manufactured more easily, than the main element 3.

As described above, the present embodiment can thus provide the semiconductor switch 7 which enables the reverse recovery property of the antiparallel diode 2 of the main element 3 to be improved, allowing the constituent element (high-speed free wheeling diode 4) to appropriately withstand voltages, as well as the electric-power conversion device comprising the semiconductor switch 7.

Now, a semiconductor switch according to a second embodiment will be described. The other components of the electric-power conversion device according to the present embodiment are the same as those of the above-described first embodiment and are denoted by the same reference numerals. These components will not be described below in detail.

Figure 3:
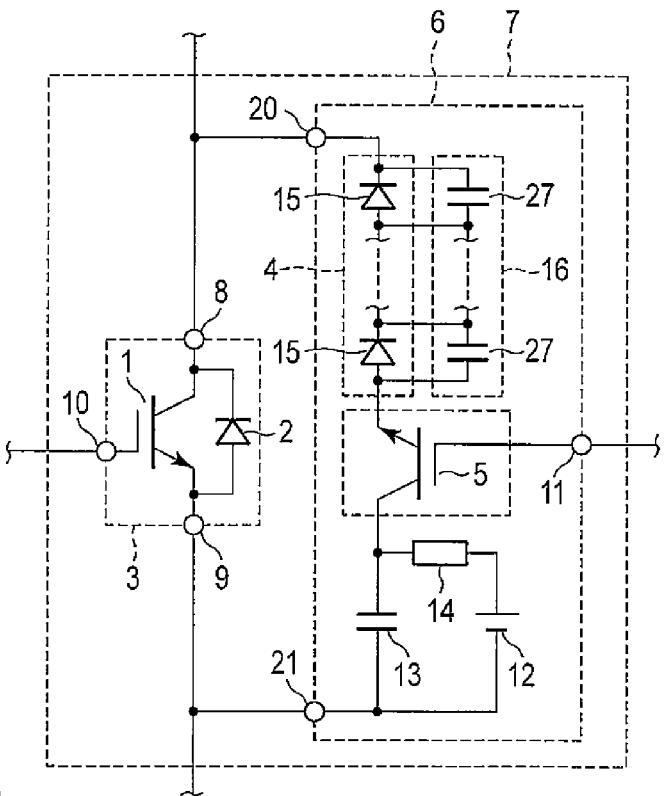
FIG. 3 is a circuit diagram showing a semiconductor switch according to a second embodiment.

As shown in FIG. 3, the reverse voltage application circuit 6 further comprises a balance capacitor 16. The balance capacitor 16 comprises a plurality of capacitors 27 with an equal capacity. Each of the capacitors 27 is connected, on a one-to-one basis, in parallel with a corresponding one of the diodes 15 forming the high-speed free wheeling diode 4.

According to the semiconductor switch 7 according to the second embodiment, the semiconductor switch 7 comprises the main element 3 comprising the switching element 1 and the antiparallel diode 2, and the reverse voltage application circuit 6 configured to apply a reverse voltage lower than the withstand voltage of the main element 3 to the antiparallel diode 2. Thus, as is the case with the first embodiment, the high-speed free wheeling diode 4 performs a reverse recovery operation instead of the antiparallel diode 2, enabling a significant reduction in a surge current resulting from the reverse recovery.

The reverse voltage application circuit 6 comprises a plurality of capacitors 27 connected, on a one-to-one basis, in parallel with the plurality of diodes 15 and having an equal capacity. This allows the voltages assigned to the respective diodes 15 to be more reliably made uniform. Consequently, possible failures in the high-speed free wheeling diode 4 (diodes 15) can be further inhibited.

As described above, the present embodiment can provide the semiconductor switch 7 which enables the reverse recovery property of the antiparallel diode 2 of the main element 3 to be improved, allowing the constituent element (high-speed free wheeling diode 4) to appropriately withstand voltages.

Now, a semiconductor switch according to a third embodiment will be described. The other components of the electric-power conversion device according to the present embodiment are the same as those of the above-described first embodiment and are denoted by the same reference numerals. These components will not be described below in detail.

As shown in FIG. 4, the reverse voltage application circuit 6 comprises a diode 15. The diode 15 includes an anode connected to the negative terminal (negative terminal 21) of the auxiliary electric-power supply 12 and a cathode connected to the negative terminal of the auxiliary element 5.

According to the semiconductor switch 7 according to the third embodiment, the semiconductor switch 7 comprises the main element 3 comprising the switching element 1 and the antiparallel diode 2, and the reverse voltage application circuit 6 configured to apply a reverse voltage lower than the withstand voltage of the main element 3 to the antiparallel diode 2. Thus, as is the case with the first embodiment, the high-speed free wheeling diode 4 performs a reverse recovery operation instead of the antiparallel diode 2, enabling a significant reduction in a surge current resulting from the reverse recovery.

The diode 15 includes the anode connected to the negative terminal of the auxiliary electric-power supply 12 and the cathode connected to the negative terminal of the auxiliary element 5. This allows the auxiliary element 5 to be prevented from undergoing an overvoltage equal to or higher than the voltage of the auxiliary electric-power supply 12. Thus, possible failures in the high-speed auxiliary element 5 such as the possible destruction of the auxiliary element 5 can be inhibited.

As described above, the present embodiment can provide the semiconductor switch 7 which enables the reverse recovery property of the antiparallel diode 2 of the main element 3 to be improved, allowing the constituent element (auxiliary element 5) to appropriately withstand voltages.

Now, a semiconductor switch according to a fourth embodiment will be described. The other components of the electric-power conversion device according to the present embodiment are the same as those of the above-described first embodiment and are denoted by the same reference numerals. These components will not be described below in detail.

As shown in FIG. 5, the reverse voltage application circuit 6 comprises, as another anti-parallel diode, an antiparallel diode 28 connected in anti-parallel with the auxiliary element 5.

According to the semiconductor switch 7 according to the fourth embodiment, the semiconductor switch 7 comprises the main element 3 comprising the switching element 1 and the antiparallel diode 2, and the reverse voltage application circuit 6 configured to apply a reverse voltage lower than the withstand voltage of the main element 3 to the antiparallel diode 2. Thus, as is the case with the first embodiment, the high-speed free wheeling diode 4 performs a reverse recovery operation instead of the antiparallel diode 2, enabling a significant reduction in a surge current resulting from the reverse recovery.

The reverse voltage application circuit 6 comprises the antiparallel diode 28 connected in anti-parallel with the auxiliary element 5. This allows the auxiliary element 5 to be prevented from undergoing the reverse voltage. Thus, possible failures in the auxiliary element 5 such as the possible destruction of the auxiliary element 5 can be inhibited.

As described above, the present embodiment can provide the semiconductor switch 7 which enables the reverse recovery property of the antiparallel diode 2 of the main element 3 to be improved, allowing the constituent element (auxiliary element 5) to appropriately withstand voltages.

Now, a semiconductor switch according to a fifth embodiment will be described. The other components of the electric-power conversion device according to the present embodiment are the same as those of the above-described first embodiment and are denoted by the same reference numerals. These components will not be described below in detail.

Figure 6:
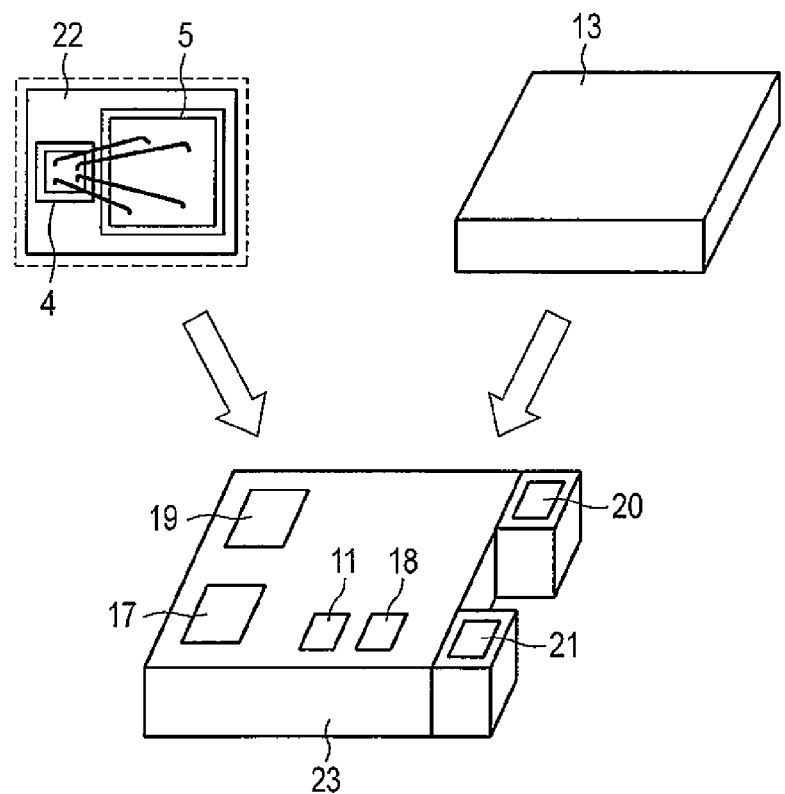
FIG. 6 is a schematic diagram showing a part of a semiconductor switch according to a fifth embodiment and showing a high-speed free wheeling diode, an auxiliary element, and a capacitor assembled into a module.

As shown in FIG. 6, the semiconductor switch 7 comprises a case (package) 23. The reverse voltage application circuit 6 comprises an insulating board 22. The high-speed free wheeling diode 4 (semiconductor chip) and the auxiliary element 5 (semiconductor chip) are mounted on the same board 22. The high-speed free wheeling diode 4, the auxiliary element 5, the board 22 and the capacitor 13 are accommodated in the case 23. The auxiliary element 5 and the capacitor 13 are accommodated in the case 23 so as to be electrically connected to each other. As described above, the high-speed free wheeling diode 4, the auxiliary element 5 and the capacitor 13 are assembled into a module.

The positive terminal 20, the negative terminal 21, a positive terminal 17 and a negative terminal 19 of the capacitor 13, the control terminal 11, and a negative terminal 18 (a terminal of side which is connected to the high-speed free wheeling diode 4) of the auxiliary element 5 are provided outside the case 23 and can be connected to external devices.

Furthermore, in the present embodiment, the high-speed free wheeling diode 4 and the auxiliary element 5 are formed using discrete semiconductors.

According to the semiconductor switch 7 according to the fifth embodiment, the semiconductor switch 7 comprises the main element 3 comprising the switching element 1 and the antiparallel diode 2, and the reverse voltage application circuit 6 configured to apply a reverse voltage lower than the withstand voltage of the main element 3 to the antiparallel diode 2. Thus, as is the case with the first embodiment, the high-speed free wheeling diode 4 performs a reverse recovery operation instead of the antiparallel diode 2, enabling a significant reduction in a surge current resulting from the reverse recovery.

The high-speed free wheeling diode 4, the auxiliary element 5, and the capacitor 13 are assembled into a compact module, thus enabling a reduction in circuit inductance. This enables the inhibition of possible failures in the switching element 1, the auxiliary element 5, or the like resulting from a surge current, such as the possible destruction of the switching element 1, the auxiliary element 5, or the like.

Furthermore, the high-speed free wheeling diode 4, the auxiliary element 5, and the capacitor 13 can be handled at the module level. Thus, these components can be easily handled. For example, the high-speed free wheeling diode 4, the auxiliary element 5, and the capacitor 13, when assembled into a device, can be easily attached to the device.

As described above, the present embodiment can provide the semiconductor switch 7 which enables the reverse recovery property of the antiparallel diode 2 of the main element 3 to be improved, allowing the constituent elements (switching element 1, auxiliary element 5, and the like) to appropriately withstand voltages.

Now, a semiconductor switch according to a sixth embodiment will be described. The other components of the electric-power conversion device according to the present embodiment are the same as those of the above-described fifth embodiment and are denoted by the same reference numerals. These components will not be described below in detail.

Figure 7:
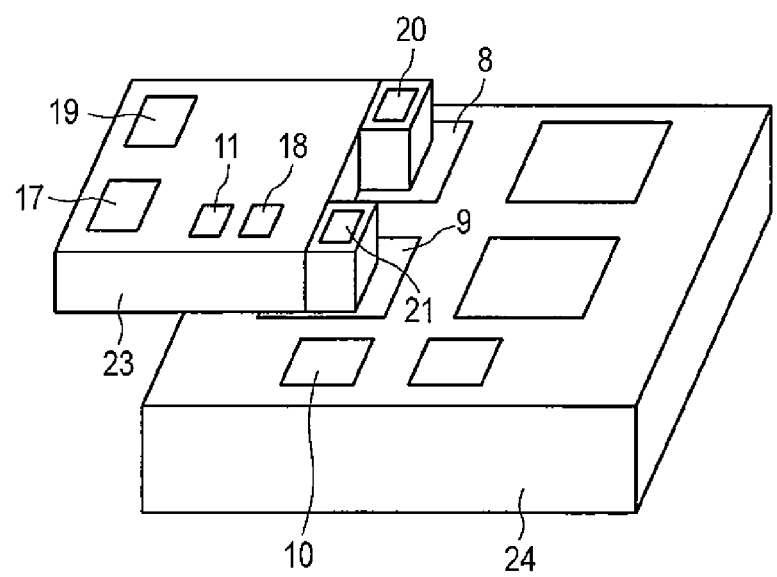
FIG. 7 is a schematic diagram showing a part of a semiconductor switch according to a sixth embodiment and showing that a main element module is connected to a case shown in FIG. 6.

As shown in FIG. 7, the semiconductor switch 7 comprises another case (package) 24. The main element 3 (switching element 1 and antiparallel diode 2) is accommodated in the case 24. As described above, the switching element 1 and the antiparallel diode 2 are assembled into a module. The positive terminal 8, the negative terminal 9 and the control terminal 10 are provided outside the case 24 and can be connected to external devices.

The case 23 is connected to the case 24. Specifically, the positive terminal 20 and negative terminal 21 provided outside the case 23 are connected to the positive terminal 8 and negative terminal 9 provided outside the case 24.

According to the semiconductor switch 7 according to the sixth embodiment, the semiconductor switch 7 comprises the main element 3 comprising the switching element 1 and the antiparallel diode 2, and the reverse voltage application circuit 6 configured to apply a reverse voltage lower than the withstand voltage of the main element 3 to the antiparallel diode 2. Thus, as is the case with the first embodiment, the high-speed free wheeling diode 4 performs a reverse recovery operation instead of the antiparallel diode 2, enabling a significant reduction in a surge current resulting from the reverse recovery.

The terminals provided outside the case 23 are connected to the terminals provided outside the case 24. Consequently, the semiconductor switch 7 as a whole is made compact, thus enabling a reduction in circuit inductance. This enables the inhibition of possible failures in the switching element 1, the auxiliary element 5, or the like resulting from a surge current, such as the possible destruction of the switching element 1, the auxiliary element 5, or the like.

Furthermore, the main element 3 can be handled at the module level. Thus, the main element 3 can be easily handled. For example, the main element 3, when assembled into a device, can be easily attached to the device.

As described above, the present embodiment can provide the semiconductor switch 7 which enables the reverse recovery property of the antiparallel diode 2 of the main element 3 to be improved, allowing the constituent elements (switching element 1, auxiliary element 5, and the like) to appropriately withstand voltages.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the above-described semiconductor switch can be utilized not only for the above-described electric-power conversion device but also for various other electric-power conversion devices and other electronic devices.

What is claimed is:

1. A semiconductor switch to be provided in a power conversion device and to be connected in series to a second semiconductor switch between a positive line and a negative line of the power conversion device, the semiconductor switch comprising:
   a main element including a voltage-drive-type switching element and an antiparallel diode connected in anti-parallel with the switching element; and
   a reverse voltage application circuit which is connected in parallel with the main element, and which includes a high-speed free wheeling diode, a capacitor, and an auxiliary element;
   wherein:
   the high-speed free wheeling diode comprises a plurality of diodes connected in series to each other, and has a reverse recovery time which is shorter than a reverse recovery time of the antiparallel diode, and a reverse recovery charge which is smaller than a reverse recovery charge of the antiparallel diode;
   the capacitor is connected in parallel to a power supply;
   the auxiliary element is turned on at a dead time set before the second semiconductor switch is turned on; and
   the high-speed free wheeling diode, the capacitor, and the auxiliary element are connected in series to each other.

2. The semiconductor switch according to claim 1, wherein the auxiliary element has a withstand voltage which is lower than a withstand voltage of the main element.

3. The semiconductor switch according to claim 1, wherein a second capacitor is connected in parallel with each of the plurality of diodes in the high-speed free wheeling diode.

4. The semiconductor switch according to claim 1, wherein a charging resistor is connected in series to the power supply.

5. A semiconductor switch to be provided in a power conversion device and to be connected in series to a second semiconductor switch between a positive line and a negative line of the power conversion device, the semiconductor switch comprising:
   a main element including a voltage-drive-type switching element and a first antiparallel diode connected in anti-parallel with the switching element; and
   a reverse voltage application circuit which is connected in parallel with the main element, and which includes a high-speed free wheeling diode, a capacitor, and an auxiliary element;
   wherein:
   the high-speed free wheeling diode has a reverse recovery time which is shorter than a reverse recovery time of the antiparallel diode, and a reverse recovery charge which is smaller than a reverse recovery charge of the antiparallel diode;
   the capacitor is connected in parallel to a power supply;
   the auxiliary element is turned on at a dead time set before the second semiconductor switch is turned on;
   the high-speed free wheeling diode, the capacitor, and the auxiliary element are connected in series to each other; and
   a diode is connected in parallel with the capacitor and the auxiliary element which are connected in series to each other.

6. A semiconductor switch to be provided in a power conversion device and to be connected in series to a second semiconductor switch between a positive line and a negative line of the power conversion device, the semiconductor switch comprising:
   a main element including a voltage-drive-type switching element and a first antiparallel diode connected in anti-parallel with the switching element; and
   a reverse voltage application circuit which is connected in parallel with the main element, and which includes a high-speed free wheeling diode, a capacitor, an auxiliary element, and a second antiparallel diode;
   wherein:
   the high-speed free wheeling diode has a reverse recovery time which is shorter than a reverse recovery time of the first antiparallel diode, and a reverse recovery charge which is smaller than a reverse recovery charge of the first antiparallel diode;
   the capacitor is connected in parallel to a power supply;
   the auxiliary element is turned on at a dead time set before the second semiconductor switch is turned on;
   the second antiparallel diode is connected in anti-parallel with the auxiliary element; and
   the high-speed free wheeling diode, the capacitor, and the auxiliary element are connected in series to each other.

7. A power conversion device comprising:
   first and second semiconductor switches connected in series to each other between a positive line and a negative line, the first semiconductor switch being connected to the positive line, and the second semiconductor switch being connected to the negative line;
   wherein the first semiconductor switch comprises:
      a first main element including a voltage-drive-type switching element and an antiparallel diode connected in anti-parallel with the switching element; and
      a first reverse voltage application circuit which is connected in parallel with the first main element, and which includes a high-speed free wheeling diode, a capacitor, and an auxiliary element;
      wherein:
      the high-speed free wheeling diode comprises a plurality of diodes connected in series to each other, and has a reverse recovery time which is shorter than a reverse recovery time of the antiparallel diode, and a reverse recovery charge which is smaller than a reverse recovery charge of the antiparallel diode;
      the capacitor is connected to a power supply;
      the auxiliary element is turned on at a dead time set before the second semiconductor switch is turned on; and
      the high-speed free wheeling diode, the capacitor, and the auxiliary element are connected in series to each other; and
   wherein the second semiconductor switch comprises:
      a second main element including a voltage-drive-type switching element and an antiparallel diode connected in anti-parallel with the switching element; and
      a second reverse voltage application circuit which is connected in parallel with the second main element, and which includes a high-speed free wheeling diode, a capacitor, and an auxiliary element;
      wherein:
      the high-speed free wheeling diode comprises a plurality of diodes connected in series to each other, and has a reverse recovery time which is shorter than a reverse recovery time of the antiparallel diode, and a reverse recovery charge which is smaller than a reverse recovery charge of the antiparallel diode;

the capacitor is connected to a power supply;

the auxiliary element is turned on at a dead time set before the first semiconductor switch is turned on; and the high-speed free wheeling diode, the capacitor, and the auxiliary element are connected in series to each other.

8. The power conversion device according to claim 7, wherein:

the auxiliary element of the first reverse voltage application circuit has a withstand voltage which is lower than a withstand voltage of the first main element; and the auxiliary element of the second reverse voltage application circuit has a withstand voltage which is lower than a withstand voltage of the second main element.

9. The power conversion device according to claim 7, wherein:

a second capacitor is connected in parallel with each of the plurality of diodes in the high-speed free wheeling diode of the first reverse voltage application circuit; and a second capacitor is connected in parallel with each of the plurality of diodes in the high-speed free wheeling diode of the second reverse voltage application circuit.

10. The power conversion device according to claim 7, wherein:

a charging resistor is connected in series to the power supply of the first reverse voltage application circuit; and a charging resistor is connected in series to the power supply of the second reverse voltage application circuit.

* * * * *